United States Patent [19]
Lin et al.

[11] Patent Number: 5,880,006
[45] Date of Patent: Mar. 9, 1999

[54] METHOD FOR FABRICATION OF A SEMICONDUCTOR DEVICE

[75] Inventors: Xi-Wei Lin, Fremont; Henry Lee, San Francisco, both of Calif.; Ian R. Harvey, Kaysville, Utah

[73] Assignee: VLSI Technology, Inc., San Jose, Calif.

[21] Appl. No.: 83,674

[22] Filed: May 22, 1998

[51] Int. Cl.⁶ .................................................. H01L 21/84
[52] U.S. Cl. .......................... 438/424; 438/156; 438/173; 438/294; 438/296
[58] Field of Search ....................................... 438/156, 173, 438/424, 221, 504, 294, 296

[56] References Cited

U.S. PATENT DOCUMENTS

| | | |
|---|---|---|
| 4,869,781 | 9/1989 | Euen et al. . |
| 4,956,314 | 9/1990 | Tam et al. . |
| 5,130,268 | 7/1992 | Liou et al. . |
| 5,173,439 | 12/1992 | Dash et al. . |
| 5,210,435 | 5/1993 | Roth et al. . |
| 5,290,396 | 3/1994 | Schoenborn et al. . |
| 5,358,891 | 10/1994 | Tsang et al. . |
| 5,374,585 | 12/1994 | Smith et al. . |
| 5,385,861 | 1/1995 | Bashir et al. . |
| 5,447,884 | 9/1995 | Fahey et al. . |
| 5,472,905 | 12/1995 | Paek et al. . |
| 5,474,953 | 12/1995 | Shimizu et al. . |
| 5,480,832 | 1/1996 | Miura et al. . |
| 5,492,858 | 2/1996 | Bose et al. . |
| 5,498,565 | 3/1996 | Gocho et al. . |
| 5,516,625 | 5/1996 | McNamara et al. . |
| 5,567,553 | 10/1996 | Hsu et al. . |
| 5,622,596 | 4/1997 | Armacost et al. . |
| 5,681,771 | 10/1997 | Hwang ..................................... 438/217 |
| 5,723,370 | 3/1998 | Ning et al. ............................... 438/156 |

*Primary Examiner*—Charles Bowers
*Assistant Examiner*—David S. Blum
*Attorney, Agent, or Firm*—Woodard, Emhardt, Naughton, Moriarity & McNett

[57] ABSTRACT

A method for forming a semiconductor structure on an active area mesa with minimal loss of field oxide deposited in isolation trenches adjacent the mesa. The trench insulating material is protected by an etch barrier layer having at least a partial resistance to etchants used in further device processing steps. The barrier layer may also be deposited over the surface of the substrate to protect it from damage during device processing. The barrier layer may be removed by an etchant having a selectivity for the barrier layer over that of the surrounding device elements. Final processing of the device may be completed once the barrier layer is removed.

18 Claims, 5 Drawing Sheets

METHOD FOR FABRICATION OF A SEMICONDUCTOR DEVICE

BACKGROUND OF THE INVENTION

This invention relates to improvements in integrated circuit processing, and more particularly, to minimizing damage to previously defined isolation structures and semiconductor surfaces during subsequent device processing steps.

Device isolation typically is achieved by utilizing local oxidation of silicon ("LOCOS") or shallow trench isolation ("STI") techniques. In the STI device isolation technique, isolation commonly is provided by forming a recess or trench between two active area mesas, upon which the electronic devices are located and filling the trench with an insulating material. Shallow trench isolation serves to provide higher packing density, improved isolation and greater planarity, by avoiding the topographical irregularities encountered when using conventional thick film oxide isolation (LOCOS). Typically, trench isolation technology includes a planarization process to remove oxide from the active area mesas and maintain oxide in the trenches.

Several techniques have been developed for planarization of wafer surfaces as part of trench isolation processing. These techniques are well known and have been disclosed in U.S. Pat. Nos. 5,492,858; 5,498,565; and 5,290,396.

FIG. 1 shows an active area mesa 16 formed on a semiconductor substrate 12 and isolated from surrounding semiconductor areas by insulating oxide 14 deposited in isolation trench 13 and insulating material 15 deposited in isolation trench 17. As shown in FIG. 1, surface 20 of substrate 12 is substantially planar with surfaces 18 and 19 of insulating materials 14 and 15, respectively. As previously explained, the process of planarization to remove insulating material from the surface of active area mesas and to maintain the material in the trenches is well known in the art.

Referring now to FIG. 2, a gate electrode 30 is formed on active area mesa 16 and is surrounded by spacer oxide 32. As known in the art, the surrounding semiconductor material is doped 26 as desired. Once spacer oxide 32 has been formed, the device may be processed to create a silicide layer 21 over the exposed semiconductor surfaces.

As shown in FIG. 2, a problem with the processing techniques of the prior art is that when defining device structures after planarization, particularly spacers 32 positioned adjacent to gate electrode 30, surface 20 of the semiconductor substrate may be damaged by the etchants used to form such structures. Damage to the semiconductor surface 20 may cause poor silicide formation 28 and result in decreased device performance. In addition to damage to the semiconductor surface, a portion of the insulating material 14 and 15 filling trenches 13 and 17, respectively, may also be lost during the etching process. After completion of device processing, the surfaces 18 and 19 of insulating oxide 14 and 15, respectively, are substantially spaced from surface 20. Surfaces 18 and 19 have been reduced from their previous positions by distance 22 and 23, respectively, and are below the level of doping 26 and silicide 21. Loss of insulating material 14 and 15 in isolating trenches 13 and 17, respectively, may result in junction leakage, causing poor device performance.

Therefore, there remains a need for a convenient and cost-effective process to protect the surface of the substrate and the insulating material in place in the isolation trenches during subsequent device processing steps.

SUMMARY OF THE INVENTION

The present invention contemplates a method for forming a semiconductor structure on an active area mesa with a minimal loss of an insulation material deposited in an isolation trench adjacent the mesa. The method comprises defining a plurality of isolation trenches in a semiconductor substrate to define at least one active area mesa and filling the trenches with an insulating material. A gate electrode is formed on the active area mesa. An etch barrier material is deposited over at least the isolation material to protect it during subsequent processing steps. The etch barrier material may be extended over the semiconductor surface to protect it during subsequent etching steps. Device processing is completed by depositing additional material and etching the material with a selective etch to form integrated circuit structures. The selective etching having the ability to etch one or more of the additional materials at a rate higher than it etches the etch barrier material. Once the desired structures have been formed, an etchant having a selectivity for the etch barrier material is applied to expose the underlying structures.

One object of the present invention is to protect the insulating material in the isolation trenches from damage during subsequent device processing steps.

Another object of the present invention is to protect the surface of the semiconductor substrate during subsequent device processing steps.

Still another object of the invention is to provide a method for making integrated circuit devices having improved yield and performance.

These and other objects of the present invention will become apparent based upon the following description.

Figure 1:
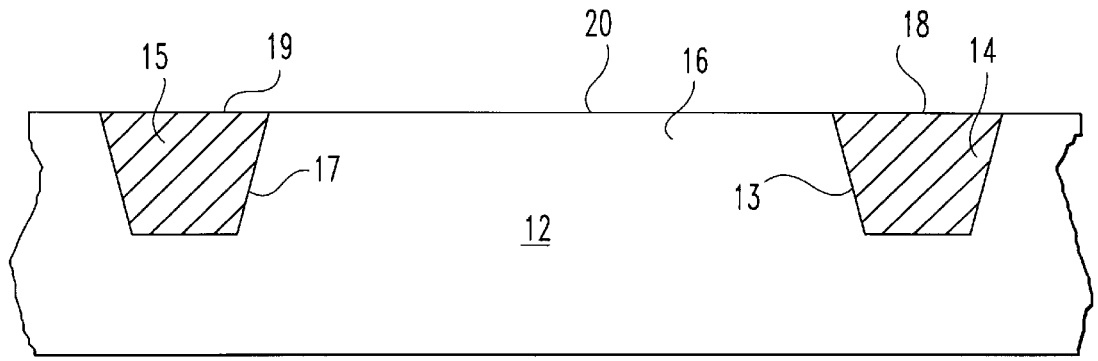
FIG. 1 shows the prior art structure of an active area mesa formed in a semiconductor substrate insulated by isolation trenches.
Figure 2:
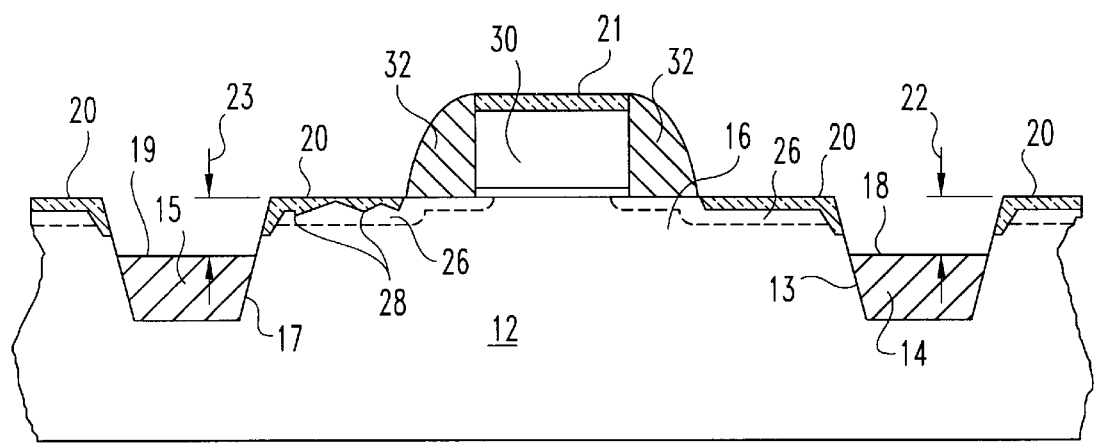
FIG. 2 is a prior art structure showing the affect of subsequent device processing steps on the substrate and isolation material in the trenches of FIG. 1.

For reasons of clarity and simplicity, the elements of the integrated circuit have not necessarily been drawn to scale. For example, the dimensions of some of the elements are exaggerated relative to each other for clarity. Further, where considered appropriate, reference numerals have been repeated among the drawings to indicated the corresponding elements.

DESCRIPTION OF THE PREFERRED EMBODIMENT

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Figure 3:
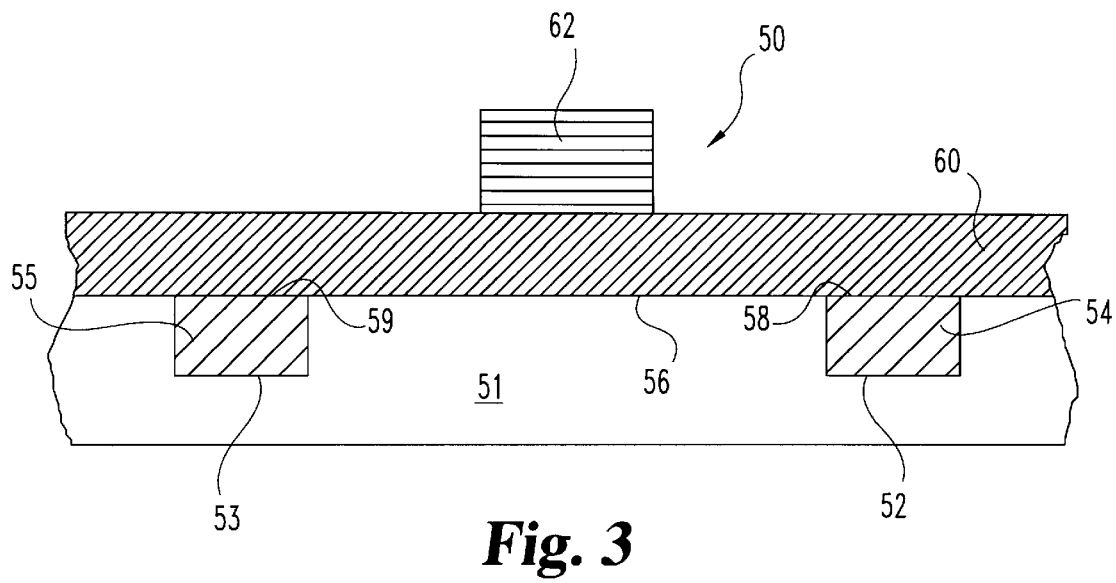
FIG. 3 is a device processing step according to the present invention showing the formation of a gate electrode.

Referring now to FIG. 3, there is shown a pre-device structure 50 in an initial processing step according to the present invention. It will be understood that FIG. 3 represents a planarized substrate 51 and isolation trenches 52 and 53 filled with insulating material 54 and 55, respectively. Although only two isolation trenches are shown, it will be understood that pre-device structure 50 includes a plurality of intersecting isolation trenches defining a plurality of active area mesas similar to active area mesa 57. The formation and filling of isolation trenches 52 and 53 is well known in the art and was briefly described with respect to the prior art structure of FIG. 1. Isolation trenches 52 and 53 may be etched to form substantially vertical side walls and filled with insulating material by chemical vapor deposition, or any other method. In a preferred embodiment, insulating material is a silicon oxide, although any material may be used provided it serves the required insulating function. As is known in the art, substrate 51 and insulating material 54 and 55 are planarized to expose surface 56 of active area mesa 57 and to maximize the level of field isolation material 54 and 55 within isolation trenches 52 and 53, respectively, thereby substantially aligning field oxide surfaces 58 and 59 with substrate surface 56. As shown in FIG. 3, a layer of polysilicon 60, or other suitable gate electrode material, is deposited on the planarized surface of substrate 51 and field isolation 54 and 55. Polysilicon 60 is patterned by a layer of photoresist material 62. The unmasked polysilicon 60 is removed by a known etching process.

Figure 4:
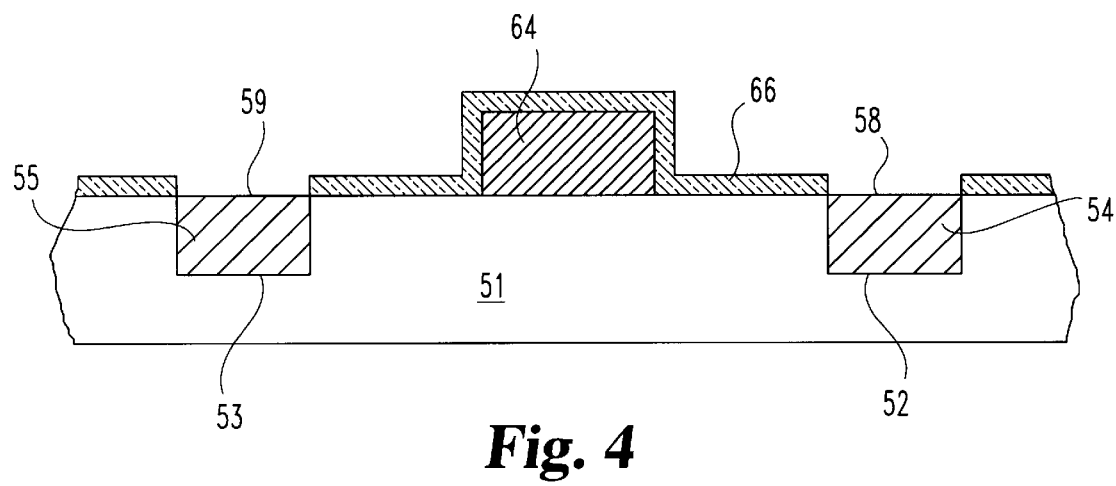
FIG. 4 is a subsequent processing step showing the growth of an oxide on the exposed semiconductor surfaces of FIG. 3.
Figure 5:
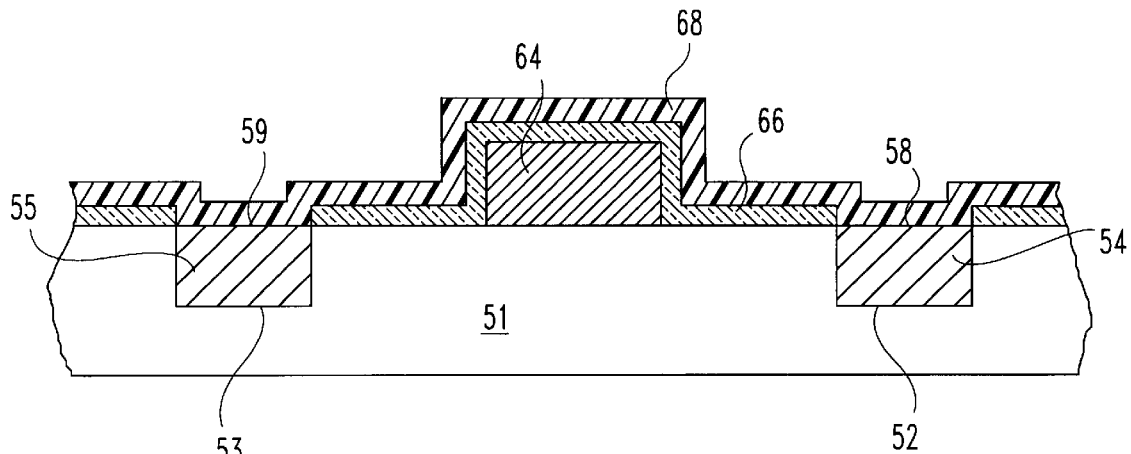
FIG. 5 shows the device of FIG. 4 with an etch barrier material deposited thereon.

FIG. 4 shows the resulting polysilicon gate 64 after etching and removal of photoresist layer 62. A layer of silicon oxide 66 is grown over substrate 51 and polysilicon gate 64. Referring now to FIG. 5, processing of the pre-device structure continues with deposition of an etch barrier layer 68 over the entire surface of silicon oxide 66 and over field isolation oxide 54 and 55. As explained further below, etch barrier layer 68 is preferably a material having dissimilar properties from subsequent device processing materials such that selective etching may be performed on subsequent layers without complete lose of the etch barrier layer. In a preferred embodiment, etch barrier layer 68 is formed of silicon nitride applied at a thickness of approximately 100 Angstroms. Silicon nitride is used for its ability to have a selective plasma etch rate with respect to a silicon oxide material. Moreover, since silicon nitride is virtually inert in hydrofluoric (HF) acid solution, it also acts as a barrier layer to protect the field oxide against wet chemical etching during post-gate processing steps. While silicon nitride is used in a preferred embodiment, it is contemplated that other etch barrier materials could be used provided they can provide at least some selectivity in etch rates in comparison to the materials utilized for subsequent device processing. One such material is silicon oxynitride, $Si_xO_yN_z$. It will be understood that in at least one example "x" may be approximately 0.5, "y" approximately 0.3, and "z" approximately 0.15, with impurities making up the remaining portion of the compound. With substantially this compound, it would preferably be deposited to a thickness of approximately 200 Angstroms to provide the same barrier effect. These values may be varied with z preferably variable between 0.1 to 0.25. The higher the value of z, the greater the resistance to oxide etchants.

Figure 6:
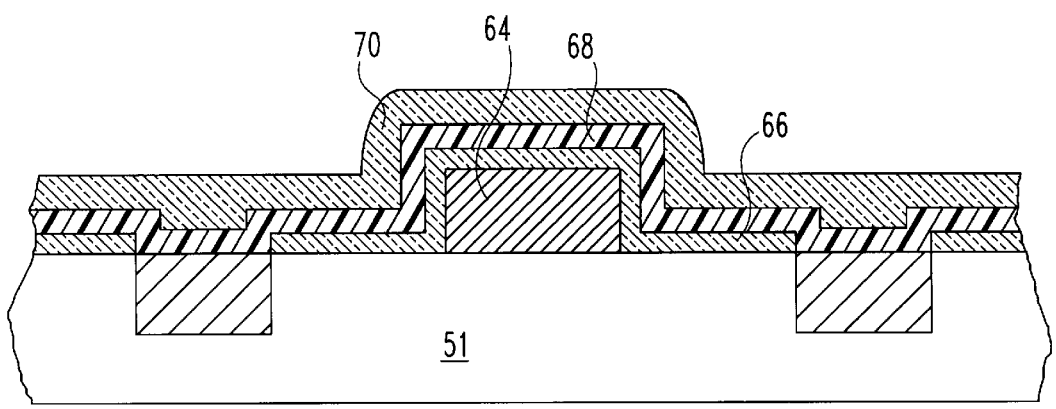
FIG. 6 shows the device of FIG. 5 with a spacer oxide deposited thereon.
Figure 7:
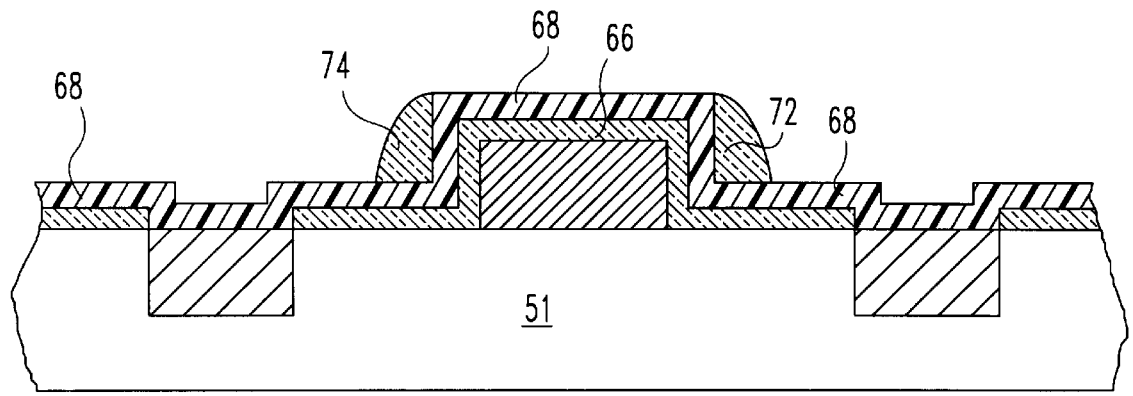
FIG. 7 shows the device of FIG. 6 with the spacer oxide etched to define spacers adjacent to the gate electrode.

FIG. 6 shows that a spacer material 70, preferably silicon oxide, is deposited over etch barrier layer 68. As known in the art, spacer oxide layer 70 is plasma etched to form spacers 72 and 74 (FIG. 7). The etchant utilized in the step of plasma etching the oxide has a rate of etching silicon oxide that is greater than the rate of etching etch barrier layer 68. In a preferred embodiment with etch barrier layer 68 formed of silicon nitride and spacer layer 70 formed of silicon oxide, the plasma etch process is achieved using a mixture of $CHF_3$ and/or $CF_4$, together with Ar. In experiments, this etchant achieved a silicon oxide-to-silicon nitride selectivity of approximately 10 to 1.

While this etching compound is used in the preferred embodiment, the invention is not limited by the etchant utilized to remove the various layers. It is contemplated that other etching compounds may also be useful in performing the present invention, particularly where alternative materials are used in the layers of the device. It will be understood that the selection of alternative etching compounds having different selectivities may also alter the preferred thickness of etch barrier layer 68. The greater the etchant's selectivity for the material forming the spacer, the less thickness is required in etch barrier layer 68.

Referring now to FIG. 7, anisotropic plasma etching forms spacers 72 and 74 adjacent gate 64. The next device processing step is to remove the exposed portions of etch barrier layer 68 not covered by spacers 72 and 74. This layer is removed by using an etchant having an etch rate substantially greater than one for etching the underlying $S_1O_2$. Although other etchants may be useful, in one embodiment a phosphoric acid solution (mixed with water $H_2O$) is particularly useful since it has a selectivity for silicon nitride-to-silicon oxide of approximately 40 to 1. While a wet etch with phosphoric acid has a high selectivity for silicon nitride, in another embodiment the manufacturing process may be enhanced by using a dry plasma etch of $CF_4$ and/or $CHF_3$ with added oxygen. This mixture has been found to have a selectivity for silicon nitride-to-silicon oxide of approximately 2 to 1. Although a dry etch has a lower selectivity for silicon nitride-to-silicon oxide, the dry etch may be preformed immediately after etching the spacer oxide without transferring the device to a separate location for wet etching.

Figure 8:
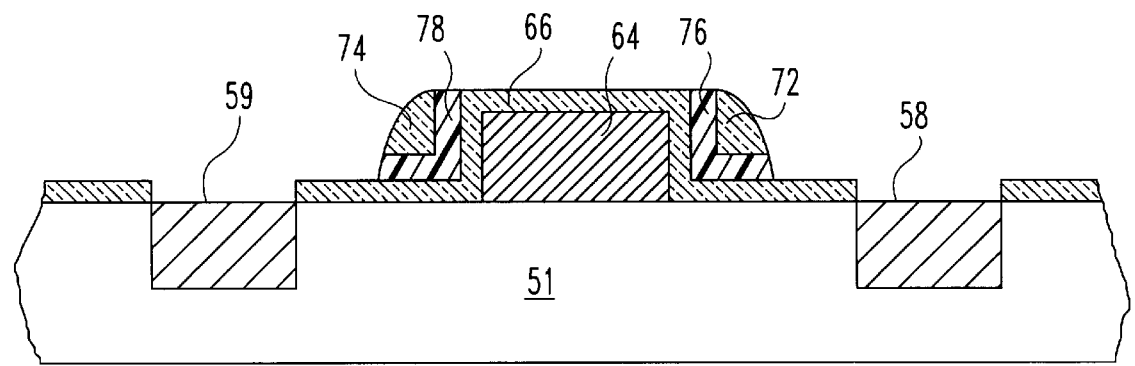
FIG. 8 shows the device of FIG. 7 with the etch barrier material etched to expose the trench isolation material.
Figure 9:
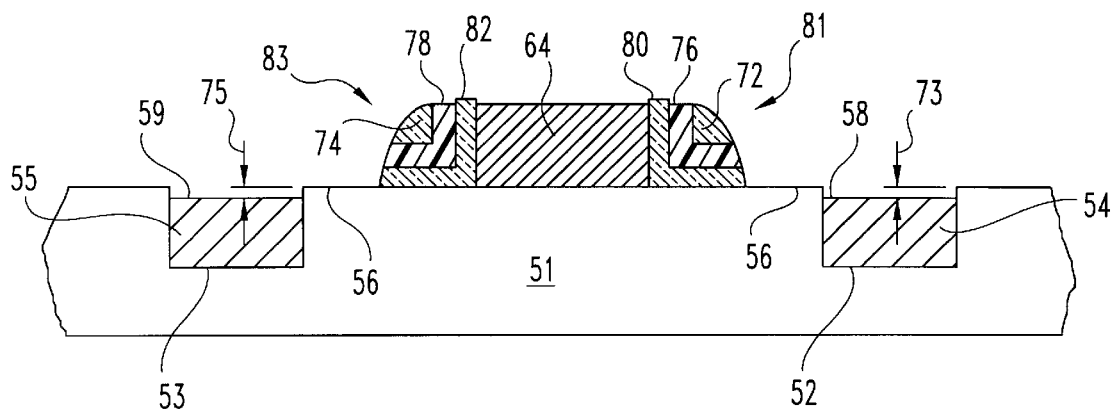
FIG. 9 shows the device of FIG. 8 with a portion of the oxide layer of FIG. 4 removed.

Referring now to FIG. 8, removal of the exposed portion of etch barrier layer 68 exposes underlying oxide layer 66 above gate 64. Surfaces 58 and 59 of the field oxide 54 and 55 in trenches 52 and 53, respectively, are also exposed. The device is further processed to remove the exposed portions of oxide layer 66. It will be understood that the removal of oxide layer 66 also results in a partial loss of field oxides 54 and 55 during the etching process (FIG. 9). Referring to FIG. 9, the amount of loss of field oxide in trenches 52 and 53 is shown by arrows 73 and 74 respectively. The thickness of oxide layer 66 is limited to prevent excessive removal of the field oxide in the trenches. It is contemplated that, if desired, this partial loss could be substantially avoided by depositing silicon oxide layer 66 rather than by growing the oxide layer from the existing silicon substrate and polysilicon gate. If a layer were deposited, it would cover the field oxide in a relatively uniform layer and etching to remove it would therefore not significantly impact the field oxide.

As shown in FIG. 9, the remainder of oxide layer 80, buffer layer 68 and spacer oxide 70 combine to form spacers 81 and 83 adjacent gate 64. Spacer 81 is formed of bottom oxide 80, etch barrier layer 76 and spacer oxide 72. In a similar fashion, spacer 83 is composed of oxide layer 82, etch barrier layer 78 and spacer oxide 74.

Figure 10:
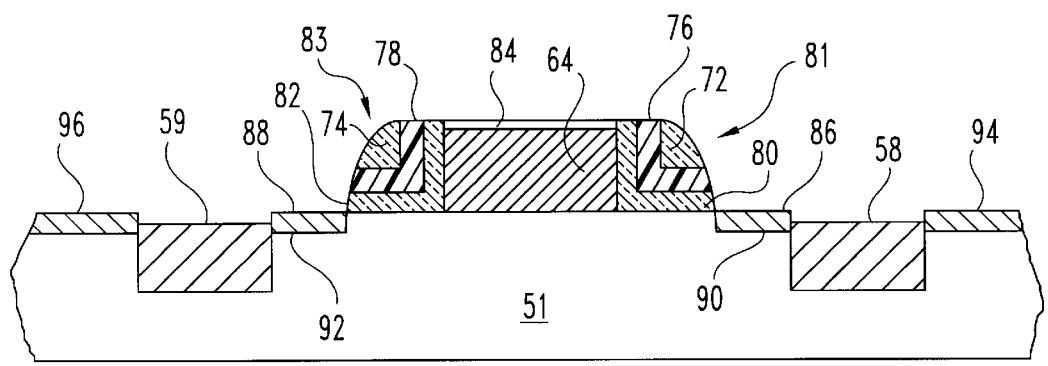
FIG. 10 shows the device of FIG. 9 after silicide formation.

As is known in the art, further device processing steps may be undertaken to increase performance. Referring now to FIG. 10, one such step is creation of silicide layer 84 above the gate 64 and silicide layers 90, 92, 94 and 96 along the surface of substrate 51. Preferably, the silicide layer is formed by deposition of titanium, followed by thermal annealing to form $TiSi_2$. Although titanium is used in a preferred embodiment, other silicides including $PtSi_2$, NiSi, TaSi, and $WSi_2$ may also be used. FIG. 10 illustrates that substrate surfaces 86 and 88 are sufficiently planar with field oxide surfaces 58 and 59, respectively, such that the silicide formation extends below the surface of the field oxide.

Although the present invention is described as a method for fabrication of a gate electrode of an isolated field effect transistor utilizing trench isolation, it is contemplated that the present invention may be utilized in fabrication of many types of microelectronic devices where it is desirable to prevent damage or loss of previously formed structures. The technique is particularly useful where a substrate has received trench isolation and has been planarized.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A method for forming a semiconductor structure, comprising:
   defining isolation trenches in a semiconductor substrate to define at least one active area mesa;
   filling the trenches with an insulating material;
   forming a gate electrode on said active area mesa;
   depositing an etch barrier of silicon nitride layer over the insulating material;
   depositing a spacer material;
   etching the spacer material with a first etchant having a selectivity for etching the spacer material at a higher rate than the etch barrier layer, thereby forming spacers adjacent the gate electrode; and
   etching the etch barrier layer with a second etchant having a selectivity for etching the etch barrier layer at a greater rate than the spacers.

2. The method of claim 1, wherein the first etchant is a plasma mixture including $CHF_3$ and $CF_4$ gas.

3. The method of claim 1, further including the step of growing an oxide layer prior to depositing the etch barrier layer.

4. The method of claim 3, wherein the etch barrier layer is deposited to a thickness of at least 100 Angstroms.

5. The method of claim 1, further including planarizing the insulating material prior to forming gate electrode.

6. The method of claim 3, further including etching the exposed oxide layer after etching of said etch barrier layer to expose the underlying substrate surface.

7. The method of claim 1, wherein said second etchant is a mixture of phosphoric acid and water.

8. The method of claim 1, wherein said etch barrier layer is silicon nitride deposited to a thickness of approximately 100 Angstrom and said first etchant is a plasma mixture of $CHF_3$ and $CF_4$ gas.

9. The method of claim 8, wherein said second etchant is the first etchant with additional oxygen.

10. A method of forming a semiconductor structure, comprising:
    etching a semiconductor substrate to form trenches defining an active area mesa;
    depositing an insulating material in the trenches;
    forming a gate electrode on the mesa;
    depositing a silicon nitride layer over at least a portion of the silicon substrate, the silicon nitride layer covering at least the insulating material;
    depositing an oxide layer;
    etching the oxide layer with a first etchant to form spacers adjacent the gate electrode, the first etchant having a selectivity for etching the oxide layer at a faster rate than the silicon nitride layer; and
    etching the nitride layer with a second etchant having a selectivity for etching silicon nitride at a faster rate than silicon oxide.

11. The method of claim 10, further including forming a second oxide layer prior to depositing the silicon nitride layer.

12. The method of claim 10, wherein the first etchant is a plasma mixture of $CHF_3$ and $CE_4$ gas.

13. The method of claim 10 wherein the second etchant is a plasma mixture of $CF_4/CHF_3$ and oxygen.

14. The method of claim 10, wherein the silicon nitride layer is approximately 100 Angstroms thick.

15. The method of claim 10, wherein etching the silicon nitride is performed using the spacers as a mask.

16. The method of claim 10, further including growing an oxide layer prior to depositing the silicon nitride layer.

17. The method of claim 16, further including the step of etching the second oxide layer after etching of the silicon nitride layer.

18. The method of claim 10, wherein the first etchant has a selectivity for etching the oxide of at least 4 to 1.

* * * * *